(12) United States Patent
Nomura et al.

(10) Patent No.: US 7,776,643 B2
(45) Date of Patent: Aug. 17, 2010

(54) SOLID STATE IMAGE PICKUP DEVICE AND ITS MANUFACTURE METHOD

(75) Inventors: Yuko Nomura, Miyagi (JP); Shinji Uya, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 170 days.

(21) Appl. No.: 12/135,517

(22) Filed: Jun. 9, 2008

(65) Prior Publication Data
US 2008/0248607 A1 Oct. 9, 2008

Related U.S. Application Data

(62) Division of application No. 11/188,646, filed on Jul. 26, 2005, now abandoned.

(30) Foreign Application Priority Data

Sep. 2, 2004 (JP) ............................. 2004-255530

(51) Int. Cl.
*H01L 21/20* (2006.01)
*H01L 21/265* (2006.01)

(52) U.S. Cl. ............ 438/79; 257/E21.617; 257/E21.63; 257/E21.644; 438/60

(58) Field of Classification Search .......... 257/E21.183, 257/E21.185, E21.187, E21.189, E21.617, 257/E21.63, E21.644; 438/57, 59, 60, 73, 438/75, 76, 78, 79
See application file for complete search history.

(56) References Cited

U.S. PATENT DOCUMENTS

| | | | |
|---|---|---|---|
| 6,599,772 B2* | 7/2003 | Abe | 438/78 |
| 6,707,495 B1 | 3/2004 | Harada | |
| 6,765,246 B2* | 7/2004 | Inagaki | 257/223 |
| 6,885,047 B2* | 4/2005 | Shinohara et al. | 257/292 |
| 6,927,091 B2* | 8/2005 | Harada | 438/60 |
| 7,198,976 B2* | 4/2007 | Hirata | 438/73 |
| 7,423,305 B2* | 9/2008 | Shinohara et al. | 257/292 |
| 7,456,453 B2* | 11/2008 | Inoue | 257/292 |

(Continued)

FOREIGN PATENT DOCUMENTS

JP 11-40794 A 2/1999

(Continued)

*Primary Examiner*—Anh Phung
*Assistant Examiner*—Michael Lulis
(74) *Attorney, Agent, or Firm*—Birch, Stewart, Kolasch & Birch, LLP (57) ABSTRACT

A solid state image pickup device is provided which includes: charge accumulation regions disposed in a semiconductor substrate in a matrix shape; a plurality of vertical transfer channels formed in the semiconductor substrate each in a close proximity to each column of the charge accumulation regions; vertical transfer electrodes formed above the vertical transfer channels; a channel protective impurity layer formed just under the vertical transfer channel and surrounding the charge accumulation region; one or more pixel separation impurity layers formed under the channel protective impurity layer and at a position facing the channel protective impurity layer; an overflow barrier region having a peak position of an impurity concentration at a position deeper than the pixel separation impurity layer, the peak position of the impurity concentration being at a depth of 3 μm or deeper from a surface of the semiconductor substrate; and a horizontal CCD for transferring signal charges transferred from the vertical transfer channels in a horizontal direction.

10 Claims, 9 Drawing Sheets

U.S. PATENT DOCUMENTS

| | | | |
|---|---|---|---|
| 7,535,038 B2 * | 5/2009 | Wada et al. | 257/219 |
| 7,642,581 B2 * | 1/2010 | Inoue | 257/292 |
| 7,642,614 B2 * | 1/2010 | Hirata | 257/446 |
| 7,705,381 B2 * | 4/2010 | Shinohara et al. | 257/292 |
| 2004/0000681 A1 | 1/2004 | Shinohara et al. | |
| 2005/0035382 A1 * | 2/2005 | Shinohara et al. | 257/290 |
| 2005/0184322 A1 * | 8/2005 | Inoue | 257/292 |
| 2007/0042519 A1 * | 2/2007 | Nomura et al. | 438/34 |
| 2008/0164500 A1 * | 7/2008 | Shinohara et al. | 257/292 |
| 2009/0086066 A1 * | 4/2009 | Itonaga | 348/294 |

FOREIGN PATENT DOCUMENTS

| | | |
|---|---|---|
| JP | 2000-150848 A | 5/2000 |
| JP | 2004-228140 A | 8/2004 |

* cited by examiner

SOLID STATE IMAGE PICKUP DEVICE AND ITS MANUFACTURE METHOD

CROSS REFERENCE TO RELATED APPLICATION

This application is a Divisional of application Ser. No. 11/188,646 filed on Jul. 26, 2005, now abandoned and for which priority is claimed under 35 U.S.C. §120; and this application claims priority of Application No. 2004-255530 filed in Japan on Sep. 2, 2004 under 35 U.S.C. §119; the entire contents of all are hereby incorporated by reference.

BACKGROUND OF THE INVENTION

A) Field of the Invention

The present invention relates to a solid state image pickup device having an overflow barrier region and its manufacture method.

B) Description of the Related Art

Figure 8:
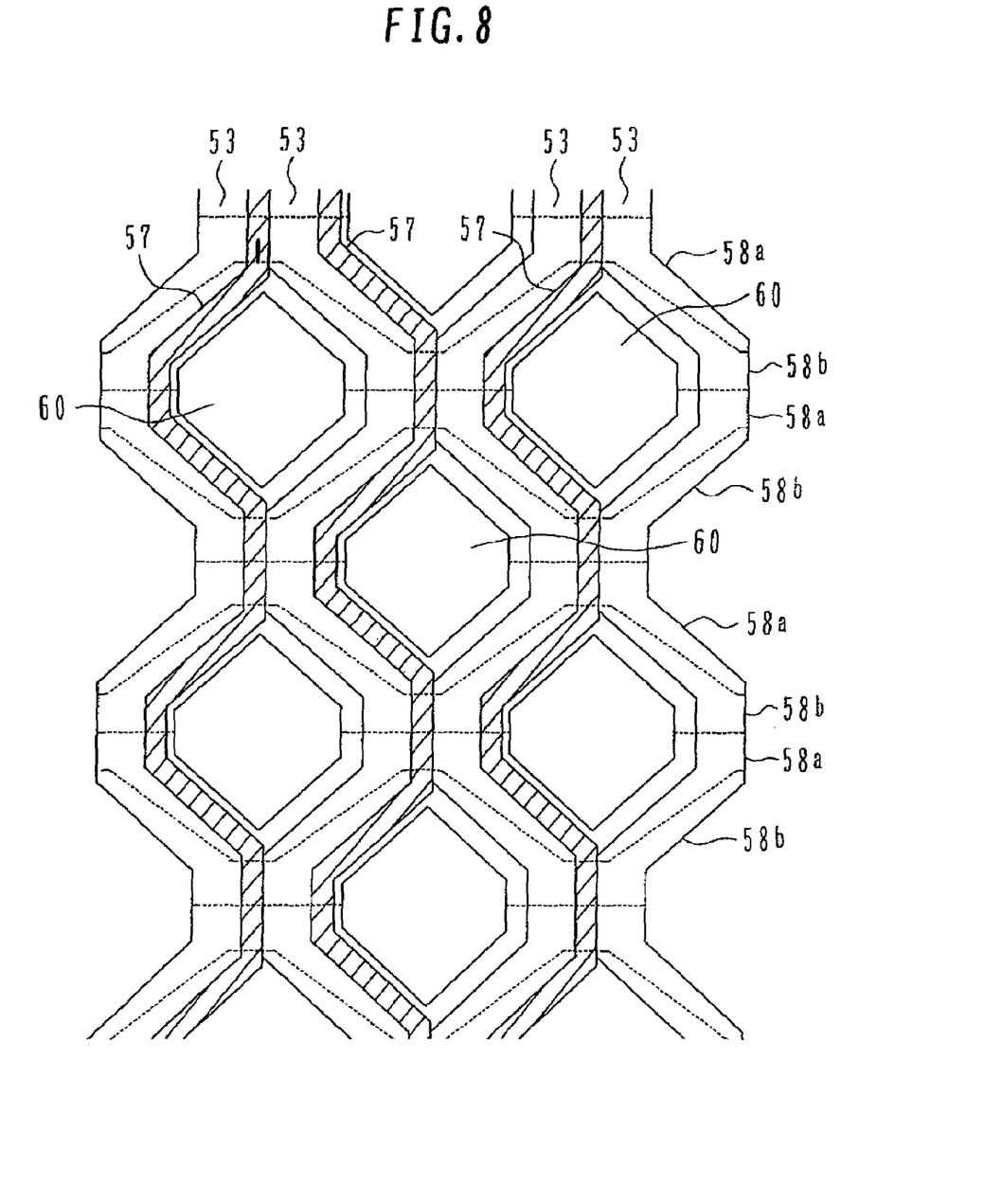
FIG. 8 is a schematic plan view of a pixel array of a solid state image pickup device.

FIG. 8 is a schematic plan view of a pixel area of a solid state image pickup device.

The pixel area is constituted of a plurality of photoelectric conversion elements 60, vertical transfer channels 53, vertical transfer electrodes (first layer vertical transfer electrodes 58a and second layer vertical transfer electrodes 58b) and element isolation regions 57.

The photoelectric conversion elements 60 are formed in a semiconductor substrate, for example, in a honeycomb layout, and generate and accumulate signal charges corresponding to an incidence light amount. The vertical transfer channel 53 is formed in the semiconductor substrate in a close proximity to the photoelectric conversion elements 60. Signal charges generated and accumulated in the photoelectric conversion elements 60 are read to the vertical charge transfer channels 53 and transferred in the vertical transfer channels 53 in a vertical direction (a down direction in FIG. 8). Drive signals (transfer voltages) are applied to the vertical transfer electrodes (first layer vertical transfer electrodes 58a and second layer vertical transfer electrodes 58b) formed above the semiconductor substrate to control potentials in the vertical transfer channels 53 and transfer the signal charges read from the photoelectric conversion elements 60 in the vertical direction. The vertical transfer electrodes are made of polysilicon or they may be made of amorphous silicon.

The element isolation region 57 is formed between adjacent photoelectric conversion elements. The element isolation region 57 is used for electrically isolating the photoelectric conversion elements 60, vertical transfer channels 53 and the like. The element isolation region 57 is shown hatched in FIG. 8.

Figure 9A:
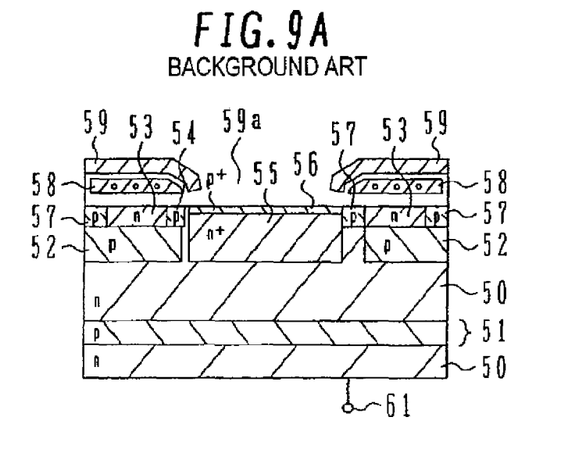
FIGS. 9A to 9C are schematic cross sectional views of pixel areas of conventional solid state image pickup devices.
Figure 9B:
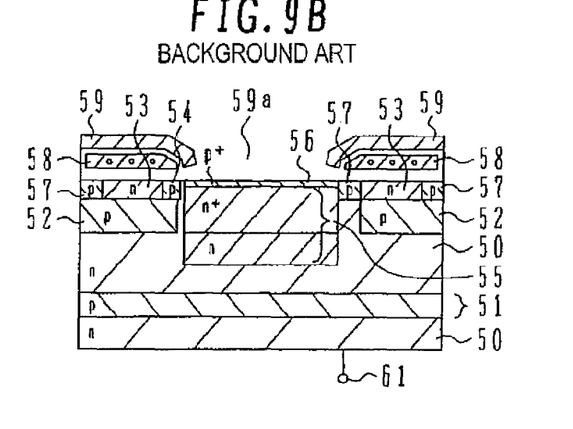
Figure 9C:
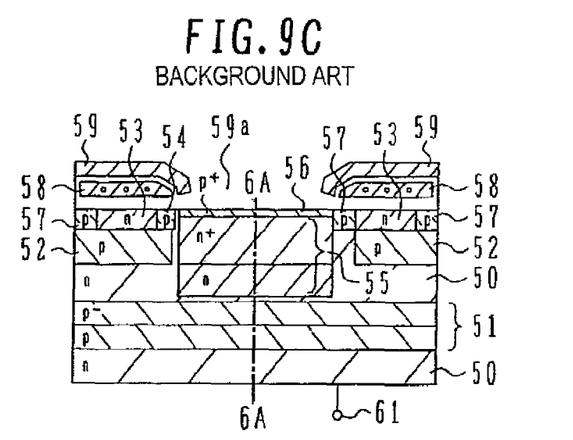

FIGS. 9A to 9C are schematic cross sectional views of conventional pixel areas of solid state image pickup devices.

Reference is made to FIG. 9A. An overflow barrier region 51 of a p-type impurity layer is formed in an n-type semiconductor substrate 50 to prevent blooming and the like. Electrons having an energy in excess of the barrier height cross the overflow region 51 and are absorbed in the n-type semiconductor substrate 50 to prevent blooming.

Formed in a surface layer of the n-type semiconductor substrate 50 are an $n^+$-type charge accumulation region 55 and a $p^+$-type burying layer 56 for burying the $n^+$-type charge accumulation region 55. The photoelectric conversion element is constituted of these regions and the like, and signal charges generated in correspondence with the incidence light amount are accumulated in the charge accumulation region 55. One pixel is constituted of one photoelectric conversion element.

In this specification, a region having an n-type impurity concentration higher than that of the n-type region is represented by an $n^+$ type region, a region having an n-type impurity concentration lower than that of the n-type region is represented by an $n^-$-type region, a region having a p-type impurity concentration higher than that of the p-type region is represented by a $p^+$ type region, a region having a p-type impurity concentration lower than that of the p-type region is represented by a $p^-$-type region.

Signal charges accumulated in the charge accumulation region 55 are read to a vertical transfer channel 53 of an n-type region via a read gate 54 of a p-type region, and transferred in the vertical transfer channel 53 in a vertical direction as a whole, as described above.

A vertical transfer electrode 58 is formed above the vertical transfer channel 53 via an insulating film (e.g., an ONO film). A voltage applied to the vertical transfer electrode 58 controls a potential of the gate 54 to read the signal charges from the charge accumulation region 55 to the vertical transfer channel 53. The signal charges in the vertical transfer channels are transferred in the vertical direction as a whole as described above.

A light shielding film 59 made of, e.g., tungsten, is formed above the vertical transfer electrode 58. An opening 59a is formed in the light shielding film 59 above the charge accumulation region 55.

A p-type impurity layer 52 formed just under the vertical transfer channel 53 protects the vertical transfer channel 53 in the sense that unnecessary charges are mixed in the vertical transfer channel 53. It also functions to reduce smear and separate pixels.

As described earlier, an element isolation region 57 is formed between adjacent photoelectric conversion elements to electrically separate photoelectric conversion elements, vertical transfer channels 53 and the like.

An electrode 61 is disposed on the n-type semiconductor substrate 50. A voltage applied to the n-type semiconductor substrate 50 via the electrode 61 performs a blooming suppressing operation of sweeping excessive charges equal to or larger than a saturation level in each pixel to the substrate and an electronic shutter operation of sweeping out charges accumulated in the charge accumulation regions 55.

Reference is made of FIG. 9B. A conventional solid state image pickup device shown in FIG. 9B is different from that shown in FIG. 9A in that a charge accumulation region 55 has a two-layer structure. In the solid state image pickup device shown in FIG. 9A, the charge accumulation region 55 is made of only a single $n^+$-type impurity layer, whereas in the device shown in FIG. 9B, the charge accumulation region 55 is made of an $n^+$-type impurity layer and a lower n-type impurity layer.

By making the charge accumulation region 55 have a multi-layer structure, it is possible to form a pn junction at a deep position of the semiconductor substrate and to broaden an effective depletion layer in the n-type region. In this specification, the effective depletion layer is intended to mean a depletion layer of the type that signal charges generated through photoelectric conversion are collected in the charge accumulation region.

Reference is made to FIG. 5C. A conventional solid state image pickup device shown in FIG. 9C is different from that shown in FIG. 9B in that an overflow barrier layer 51 has a two-layer structure. In the solid state image pickup device shown in FIG. 9B, an overflow barrier region 51 is made of only a single p-type impurity layer, whereas in the device shown in FIG. 9C, the overflow barrier layer 51 is made of an p-type impurity layer and an upper p⁻-type impurity layer.

By making the overflow barrier layer 51 have a multi-layer structure, it is possible to lower an impurity concentration of the p-type region constituting the pn junction.

Generally, light in a long wavelength range incident upon a photoelectric conversion element is photoelectrically converted at a deep position of the semiconductor substrate. The position of the overflow barrier region 51 is shallow because of recent requirements for high resolution and compactness of solid state image pickup devices. Therefore, light in the long wavelength range is photoelectrically converted invalidly at the position deeper than the overflow barrier region 51 so that a sensitivity relative to long wavelength light cannot be retained sufficiently in some cases. If the overflow barrier region 51 is formed at a deep position of the semiconductor substrate in order to retain the long wavelength light sensitivity, there arises a problem that blooming between pixels is likely to occur (e.g., refer to Japanese Patent Laid-open Publication No. 2000-150848).

SUMMARY OF THE INVENTION

An object of this invention is to provide a solid state image pickup device and its manufacture method capable of taking an image at a high quality.

According to one aspect of the present invention, there is provided a solid state image pickup device comprising: charge accumulation regions of a first conductivity type disposed in a semiconductor substrate in a matrix shape, said charge accumulation region accumulating signal charges photoelectrically converted from incidence light; a plurality of vertical transfer channels of the first conductivity type formed in said semiconductor substrate each in a close proximity to each column of said charge accumulation regions and extending in a column direction as a whole; vertical transfer electrodes formed above said formed above said vertical transfer channels, said vertical transfer electrodes controlling a potential of said vertical transfer channels and a potential of a region between said charge accumulation region and said vertical transfer channel to read the signal charges accumulated in said charge accumulation regions and transfer the signal charges along the column direction; a channel protective impurity layer of a second conductivity type opposite to the first conductivity type formed in said semiconductor substrate just under said vertical transfer channel and surrounding said charge accumulation region; one or more pixel separation impurity layers of the second conductivity type formed in said semiconductor substrate, under said channel protective impurity layer and at a position facing said channel protective impurity layer; an overflow barrier region of the second conductivity type formed in said semiconductor substrate and having a peak position of an impurity concentration at a position deeper than said pixel separation impurity layer, said peak position of the impurity concentration being at a depth of 3 µm or deeper from a surface of said semiconductor substrate; and a horizontal CCD for transferring signal charges transferred from said vertical transfer channels in a horizontal direction.

This solid state image pickup device can take an image at a high quality by suppressing a long wavelength sensitivity from being lowered and suppressing blooming between pixels.

According to another aspect of the present invention, there is provided a manufacture method for a solid state image pickup device comprising steps of: (a) implanting, into a whole surface of a semiconductor substrate of a first conductivity type, impurity ions of a second conductivity type opposite to the first conductivity type, to form an overflow barrier region; (b) implanting impurity ions of the second conductivity type into the semiconductor substrate above the overflow barrier region to form a first pixel separation impurity layer; (c) epitaxially growing a semiconductor layer on the semiconductor substrate to form an epitaxial substrate; (d) implanting impurity ions of the second conductivity type into the epitaxial substrate above the first pixel separation impurity layer to form a channel protective impurity layer surrounding a region where a charge accumulation region is to be formed; (e) implanting impurity ions of the first conductivity type into the epitaxial substrate above the channel protective impurity layer to form vertical transfer channels; (f) forming vertical transfer electrodes above the vertical transfer channel; and (g) implanting impurity ions of the first conductivity type into the epitaxial substrate in a region surrounded by the channel protective impurity layer to form the charge accumulation region, a peak position of an impurity concentration in the overflow barrier region being eventually set to a depth of 3 µm or deeper from a surface of the epitaxial substrate.

This manufacture method for a solid state image pickup device can manufacture a solid state image pickup device which can take an image at a high quality by suppressing a long wavelength sensitivity from being lowered and suppressing blooming between pixels.

DESCRIPTION OF THE PREFERRED EMBODIMENTS

Figure 1A:
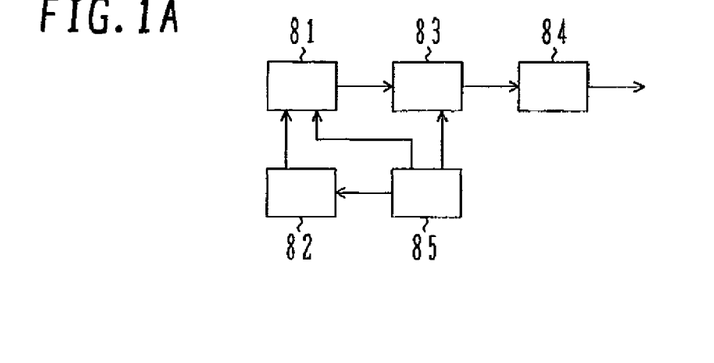
FIG. 1A is a block diagram showing the main part of a solid state image pickup apparatus assembling a solid state image pickup device.
Figure 1B:
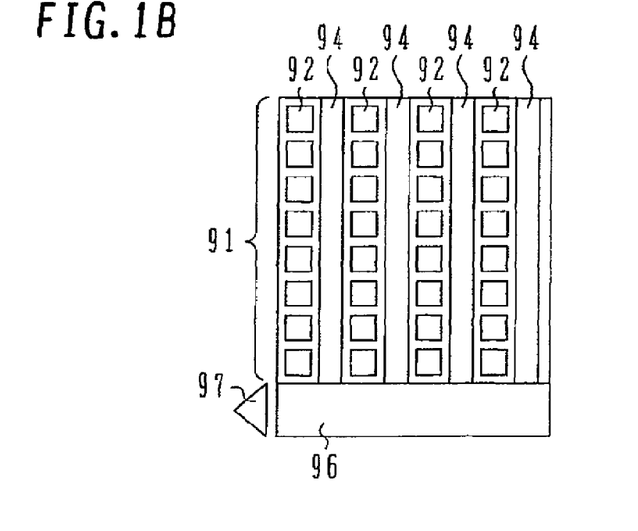
FIGS. 1B and 1C are schematic plan views showing the structures of solid state image pickup devices.
Figure 1C:
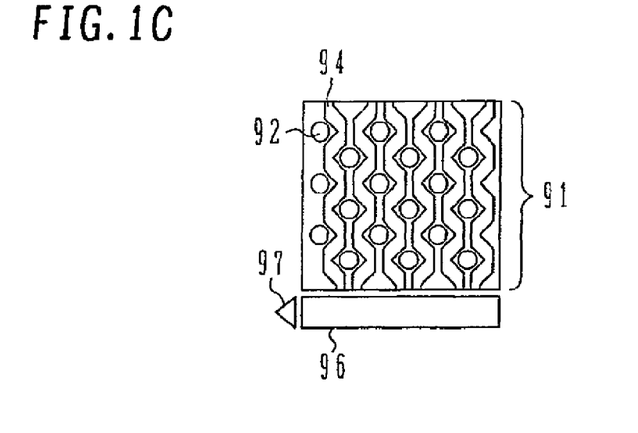

FIG. 1A is a block diagram showing a main portion of a solid state image pickup apparatus assembling a solid state image pickup device, and FIGS. 1B and 1C are schematic plan views showing the structures of solid state image pickup devices.

Reference is made to FIG. 1A. The structure of a solid state image pickup apparatus will be described. A solid state image pickup device 81 generates signal charges corresponding to an amount of light incident upon each pixel and supplies an image signal corresponding to the generated signal charges. A drive signal generator 82 generates drive signals (transfer voltage, etc.) for driving the solid state image pickup device 81 and supplies them to the solid state image pickup device 81. An analog front end (AFE) 83 subjects an output signal from the solid state image pickup device 81 to correlation double sampling, amplifies the sampled signal at an externally set gain, converts it into a digital signal, and outputs the digital signal. A digital signal processor (DSP) 84 processes an image signal supplied from the analog front end 83, such as recognition process, data compression and network control, and outputs the processed image data. A timing generator (TG) 85 generates timing signals for the solid state image pickup device 81, drive signal generator 82 and analog front end 83, to control the operations thereof.

The drive signal generator 82 includes, for example, a V driver for generating a vertical charge coupled device (CCD) drive signal. Signals supplied from the drive signal generator 82 to the solid state image pickup device 81 are a horizontal CCD drive signal, a vertical CCD drive signal, an output amplifier drive signal and a substrate bias signal.

Reference is made to FIG. 1B. The solid state image pickup device is constituted of: a plurality of photosensors 92 disposed, for example, in a matrix shape; a plurality of vertical CCDs 94 disposed near each column of the photosensors 92; a horizontal CCD 96 electrically connected to the vertical CCDs; and an amplifier circuit 97, connected to an output terminal of the horizontal CCD 96, for amplifying an output charge signal from the horizontal CCD 96. A pixel area 91 is constituted of the photosensors 92 and vertical CCDs 94. FIG. 1B shows the semiconductor substrate formed with the pixel area 91 and the like as viewed along a normal direction (as viewed from an upper position).

The photosensor 92 is constituted of a photosensitive element, e.g., a photoelectric conversion element (photodiode) and a read gate. The photoelectric conversion element generates signal charges corresponding to an incidence light amount and accumulates them. Reading the accumulated signal charges to the vertical CCD 94 is controlled by a voltage applied to the read gate. The signal charges read to the vertical CCD 94 are transferred in the vertical CCDs (vertical transfer channel) 94 toward the horizontal CCD 96 (in a vertical direction) as a whole. Signal charges transferred to the bottom ends of the vertical CCDs 94 are transferred in the horizontal CCD (horizontal transfer channel) 96 in a horizontal direction, amplified by the amplifier circuit 97 and output to an external.

The photosensors 92 are disposed in a square (tetragonal) matrix layout at a constant pitch in the row and column directions as shown in FIG. 1B, or disposed in a honeycomb layout in the row and column directions by shifting every second photosensors, for example, by a half pitch. The honeycomb layout includes photosensors 92 disposed in a first square matrix layout and photosensors 92 disposed in a second square matrix layout at positions between lattice points of the first square matrix layout.

FIG. 1C is a schematic plan view of a solid state image pickup device of a honeycomb layout. Each vertical CCD (vertical transfer channel) 94 is disposed in a zigzag way between photosensors 92.

Figure 2:
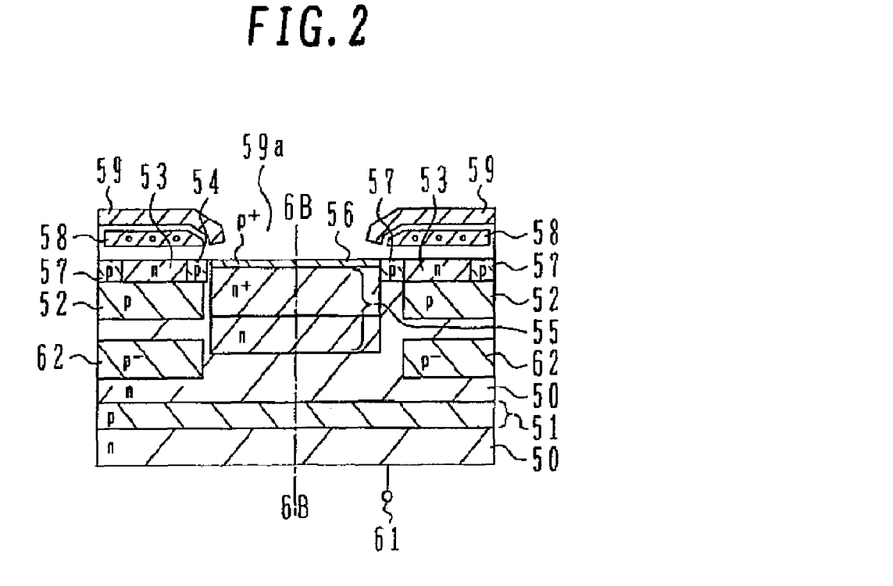
FIG. 2 is a schematic cross sectional view showing a pixel area of a solid state image pickup device according to a first embodiment.

FIG. 2 is a schematic cross sectional view of a pixel area of a solid state image pickup device according to the first embodiment.

Although the structure of the solid state image pickup device is similar to that shown in FIG. 9B, it is different in that an overflow barrier region 51 is formed deeper in an n-type semiconductor substrate 50 and that a low concentration p-type ($p^-$-type) impurity layer (pixel separation impurity layer) 62 is formed between a p-type impurity layer (channel protection impurity layer) 52 under the vertical transfer channel 53 and the overflow barrier region 51, e.g., at a middle depth between the layer 52 and region 51. The low concentration p-type ($p^-$-type) impurity layer 62 is formed under the p-type impurity layer 52 and faces the p-type impurity layer 52.

The peak position of the p-type impurity concentration of the overflow barrier region 51 is at a depth of 3.5 μm from the substrate surface. The overflow barrier region 51 can be formed at this depth by implanting p-type impurity ions at a high acceleration energy, e.g., 2.5 MeV or higher.

It is preferable to set the peak position of the p-type impurity concentration of the overflow barrier region 51 to a depth of 3.0 μm or deeper from the semiconductor substrate surface. As will be later detailed, by forming the overflow barrier region 51 at this depth, an effective photosensitive region is broadened to a deeper position of the substrate. It is therefore possible to realize a solid state image pickup device capable of taking an image at a high quality with an improved long wavelength light sensitivity.

The p-type impurity layer 52 is formed at the position surrounding a charge accumulation region 55.

As will be later detailed, by forming the p-type impurity layer 52 and low concentration p-type impurity layer 62 in this manner, it is possible to realize a solid state image pickup device capable of taking an image at a high quality and suppressing blooming between pixels. The p-type impurity layer 52 just under a vertical transfer channel 53 has a function of preventing unnecessary charges from being mixed in the vertical transfer channel 53, as described earlier.

The low concentration p-type impurity layer 62 has a p-type impurity concentration lower than, e.g., that of the p-type impurity layer 52, and also lower than, e.g., that of the p-type impurity layer constituting the overflow barrier region 51. By adjusting the impurity concentration in this manner, it becomes possible to suppress the long wavelength light sensitivity from being lowered at an earlier stage while a $V_{ofd}$ (overflow drain voltage) is raised (it becomes possible to suppress the long wavelength light sensitivity from being lowered during a movie mode).

FIGS. 10A to 10E are schematic cross sectional views illustrating a manufacture method for the solid state image pickup device of the first embodiment.

Figure 10A:
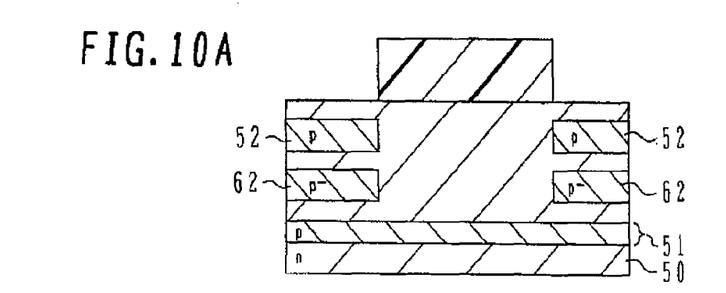
FIGS. 10A to 10E are schematic cross sectional views illustrating a manufacture method for the solid state image pickup device of the first embodiment.

Reference is made to FIG. 10A. An n-type semiconductor substrate 50 such as a silicon substrate is prepared, and p-type impurity ions, e.g., boron ions, are implanted into the whole substrate at a high acceleration energy to form an overflow barrier region 51 of a p-type impurity layer at a deep position of the substrate. For example, boron ion implantation is performed at a dose of $2\times10^{11}/cm^2$ to $4\times10^{11}/cm^2$ and an acceleration energy of 2.5 to 3 MeV.

Next, by using a photoresist pattern as a mask, p-type impurity ions, e.g., boron ions, are implanted at a dose of $1 \times 10^{11}/cm^2$ to $2 \times 10^{11}/cm^2$ and an acceleration energy of 1 to 2.5 MeV to form a low concentration p-type impurity layer 62 above the overflow barrier region 51. Next, p-type impurity ions, e.g., boron ions, are implanted at a dose of $2 \times 10^{11}/cm^2$ to $6 \times 10^{11}/cm^2$ and an acceleration energy of 500 to 1000 keV to form a p-type impurity layer 52 above the low concentration p-type impurity layer 62. For example, the dose of ion implantation for the low concentration p-type impurity layer 62 is smaller than, e.g., that for the p-type impurity layer 52, and also smaller than, e.g., that for the overflow barrier region 51.

Figure 10B:
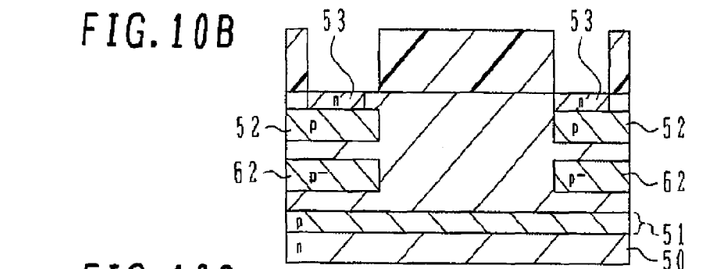

Reference is made to FIG. 10B. By using a photoresist pattern as a mask, n-type impurity ions, e.g., phosphorus ions or arsenic ions, are implanted to form a vertical transfer channel 53 above the p-type impurity layer 52.

Figure 10C:
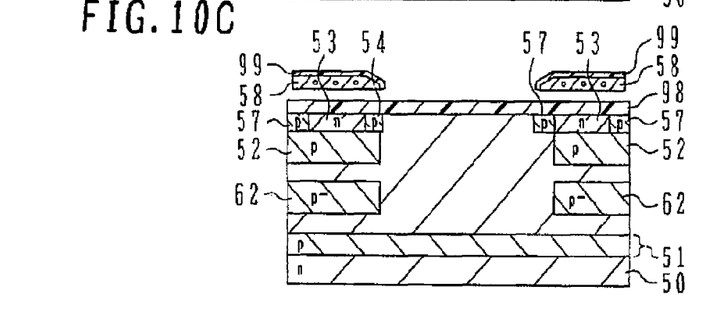

Reference is made to FIG. 10C. By using a photoresist pattern as a mask, p-type impurity ions, e.g., boron ions, are implanted to form a read gate 54 and an element isolation region 57 at the position adjacent to the vertical transfer channel 53.

Although not shown in FIG. 2, an insulating film 98 is formed on the surface of the n-type semiconductor substrate 50. For example, the insulating film 98 is an ONO film of a lamination of a silicon oxide film by thermal oxidation, a silicon nitride film by chemical vapor deposition (CVD) and a silicon oxide film by thermal oxidation.

A vertical transfer electrode 58 made of, e.g., polysilicon, is formed covering the vertical transfer channel 53 at a higher position. For example, the vertical transfer electrode 58 is constituted of vertical transfer electrodes of first and second layers. The vertical transfer electrode 58 controls the potential of the vertical transfer channel 53 to transfer signal charges generated in photoelectric conversion elements and read to the vertical transfer channel 53, in the vertical direction. The vertical transfer electrode 58 is formed by depositing polysilicon on the insulating film (ONO film) 98, for example, by CVD, and patterning it by photolithography and etching. Although not shown in FIG. 2, the vertical transfer electrode 58 is thermally oxidized to form a silicon oxide film 99 on the surface thereof.

Figure 10D:
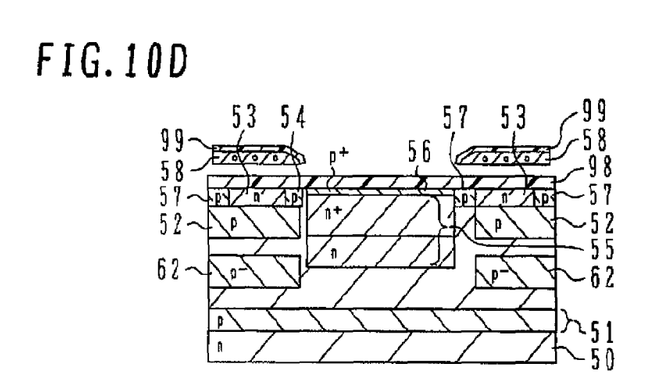

Reference is made to FIG. 10D. The vertical transfer electrode 58 is used as a mask. Alternatively, resist is coated on the vertical transfer electrode 58 and insulating film (ONO film) 98, exposed and developed to leave resist in a predetermined area, and this resist is used as a mask. By using one of these masks, n-type impurity ions, e.g., phosphorus ions or arsenic ions, are implanted to form a charge accumulation region 55, then p-type impurity ions, e.g., boron ions are implanted to form a burying region 56 burying the charge accumulation region 55.

Photoelectric conversion elements (charge accumulation regions) 55 may be disposed in a square matrix layout or a honeycomb layout. Although not shown in the cross sectional view of FIG. 2, a horizontal CCD 66 is formed in the n-type semiconductor substrate 50 by using the same processes described above.

Figure 10E:
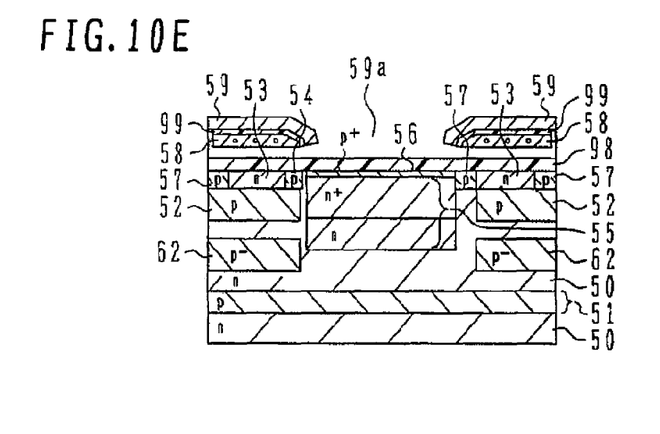

Reference is made to FIG. 10E. A light shielding film 59 made of, e.g., tungsten, is formed above the silicon oxide film 99 on the vertical transfer electrode 58. Resist is coated on the light shielding film 59, exposed and developed to leave resist in a predetermined area. By using this resist as a mask, an opening 59a is formed above the charge accumulation region 55 by etching.

Figure 3:
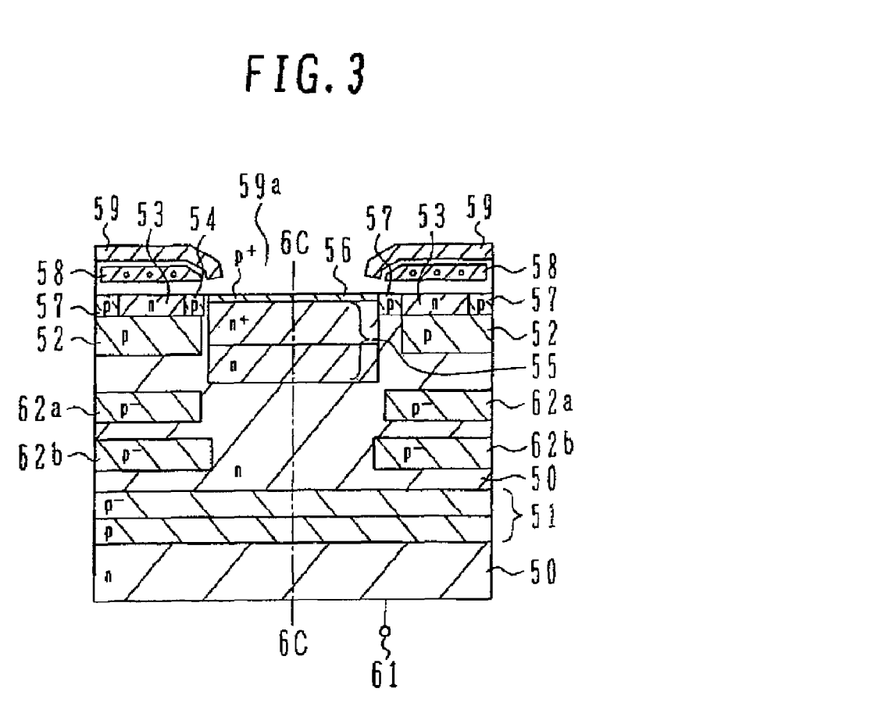
FIG. 3 is a schematic cross sectional view showing a pixel area of a solid state image pickup device according to a second embodiment.

FIG. 3 is a schematic cross sectional view of a solid state image pickup device according to the second embodiment.

A first different point from the first embodiment shown in FIG. 2 is that an overflow barrier region has a multi-layer structure (in this example, two layers) along a substrate depth direction. In the first embodiment, the overflow barrier area 51 is made of only a single p-type impurity layer, whereas in the second embodiment, the overflow barrier region 51 is made of a p-type impurity layer and an upper p$^-$-type impurity layer. A peak position of the p-type impurity concentration of the overflow barrier region 51 is at a depth of, e.g., 4.4 μm from the semiconductor substrate surface.

A preferable depth and effects of the peak position of the p-type impurity concentration of the overflow barrier region 51 are similar to the first embodiment. By making the overflow barrier region 51 have a multi-layer structure, an impurity concentration of the p-side region of a pn junction can be lowered.

A second different point is that a low concentration p-type (p$^-$-type) impurity layer (pixel separation impurity layer) has a multi-layer structure (in this example, two layers) along the substrate depth direction.

A p-type impurity layer (channel protection impurity layer) 52 is formed surrounding a charge accumulation region 55. The effects are similar to those of the first embodiment. By making the low concentration p-type impurity layer have the multi-layer structure, it is possible to prevent signal charges from moving to adjacent pixels even the barrier is made deeper.

In FIG. 3, the low concentration p-type impurity layer 62b formed on the side of the substrate bottom (overflow barrier region 51) extends under the charge accumulation region 55 more than the low concentration p-type impurity layer 62a formed on the side of the substrate surface (charge accumulation region 55). However, the two low concentration p-type impurity layers 62a and 62b may have the same width. If the width of the low concentration p-type impurity layers 62a and 62b is wide, the long wavelength light sensitivity (depletion layer thickness) is likely to be lowered at an earlier stage while the $V_{ofd}$ (overflow drain voltage) is raised (during a movie mode). It is therefore preferable that the width of the low concentration p-type impurity layers 62a and 62b is narrow (e.g., a width about that of the vertical transfer channel).

The two low concentration p-type impurity layers 62a and 62b have a p-type impurity concentration lower than, e.g., that of the p-type impurity layer 52, and also lower than, e.g., that of the p-type impurity layer or a p$^-$-type impurity layer of the overflow barrier region 51. By adjusting the impurity concentration in this manner, it becomes possible to suppress the long wavelength light sensitivity from being lowered at an earlier stage while the $V_{ofd}$ (overflow drain voltage) is raised (it becomes possible to suppress the long wavelength light sensitivity from being lowered during a movie mode).

Figure 4A:
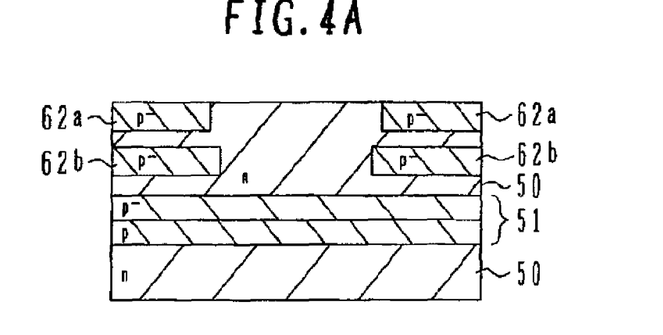
FIGS. 4A to 4C are schematic cross sectional views illustrating an example of a manufacture method for the solid state image pickup device of the second embodiment.
Figure 4B:
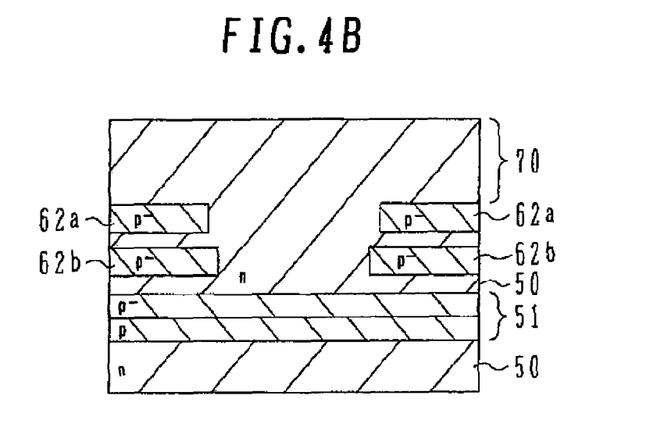
Figure 4C:
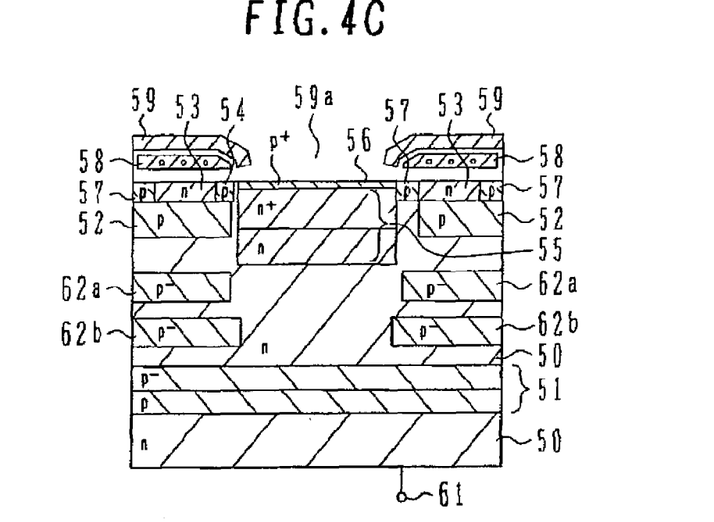

FIGS. 4A to 4C are schematic cross sectional views illustrating an example of a manufacture method for the solid state image pickup device of the second embodiment.

Reference is made to FIG. 4A. An n-type semiconductor substrate 50 such as a silicon substrate is prepared, and p-type impurity ions, e.g., boron ions, are implanted into the whole surface of the substrate to form an overflow barrier region 51 constituted of a p-type impurity layer and a p$^-$-type impurity layer. Boron ion implantation is performed twice. For example, first ion implantation is performed at a dose of $2 \times 10^{11}$ to $4 \times 10^{11}/cm^2$ and an acceleration energy of 2.5 to 3 MeV, and second ion implantation is performed at a dose of $1 \times 10^{11}$ to $2 \times 10^{11}/cm^2$ and an acceleration energy of 1.5 to 2.5 MeV.

Next, by using a photoresist pattern as a mask, p-type impurity ions, e.g., boron ions, are implanted at a dose of $1\times10^{11}/\text{cm}^2$ to $2\times10^{11}/\text{cm}^2$ and an acceleration energy of 1.5 to 2.5 MeV to form a low concentration p-type impurity layer 62b above the overflow barrier region 51. Next, p-type impurity ions, e.g., boron ions, are implanted at a dose of $1\times10^{11}/\text{cm}^2$ to $2\times10^{11}/\text{cm}^2$ $10^{11}/\text{cm}^2$ and an acceleration energy of 1 to 2 MeV to form a low concentration p-type impurity layer 62a above the low concentration p-type impurity layer 62b. It is possible to form the two low concentration p-type impurity layers 62a and 62b by using the same mask. The dose of ion implantation for the low concentration p-type impurity layers 62a and 62b is smaller than, e.g., that for the overflow barrier region 51.

The low concentration p-type impurity layer 62a is formed, e.g., near the surface of the n-type semiconductor substrate 50 shown in FIG. 4A.

Reference is made to FIG. 4B. An epitaxial layer (semiconductor layer) 70 having the same impurity concentration as that of the n-type semiconductor substrate 50 is formed on the surface of the n-type semiconductor substrate 50 to a thickness of, e.g., 2 μm, by epitaxial growth, to thereby form an epitaxial substrate.

Reference is made to FIG. 4C same as FIG. 3. By using a photoresist pattern as a mask, p-type impurity ions, e.g., boron ions, are implanted into the epitaxial layer 70 at a dose of $2\times10^{11}$ to $6\times10^{11}/\text{cm}^2$ and an acceleration energy of 500 to 1000 keV to form a p-type impurity layer 52 at the position above the low concentration p-type impurity layer 62a and facing the low concentration p-type impurity layer 62a. The dose of ion implantation for the p-type impurity layer 52 is larger than, e.g., that for the low concentration p-type impurity layers 62a and 62b.

The manufacture processes to follow are similar to those for the solid state image pickup device of the first embodiment described with reference to FIGS. 10A to 10E. The solid state image pickup device of the second embodiment can be manufactured in this manner.

If the overflow barrier region 51 or one or both of the low concentration p-type impurity layers 62a and 62b are formed by implanting impurity ions into the n-type semiconductor substrate 50 and thereafter the epitaxial layer is formed on the surface of the n-type semiconductor substrate, to be followed by subsequent manufacture processes, ion implantation for the overflow barrier region 51 or the p-type impurity layers 62a and 62b can be performed at a lower acceleration energy.

In manufacturing the solid state image pickup device of the first embodiment having a single p-type impurity layer constituting the overflow barrier region 51 and a single low concentration p-type impurity layer 62, for example, after the overflow barrier region 51 is formed, the low concentration p-type impurity layer 62 is formed near at the surface of the n-type semiconductor substrate 50, and then an epitaxial layer may be formed and other constituent elements such as the vertical transfer channel 53 and charge accumulation region 55 are formed in the epitaxial layer.

An epitaxial layer may be formed a plurality of times. This will be described by using as an example the manufacture method for the solid stage image pickup device of the second embodiment.

FIGS. 5A to 5E are schematic cross sectional views illustrating another example of a manufacture method for the solid state image pickup device of the second embodiment.

Figure 5A:
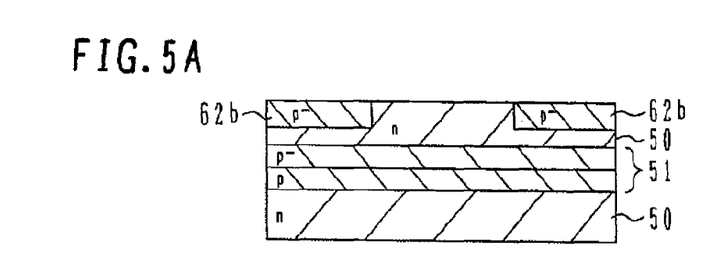
FIGS. 5A to 5E are schematic cross sectional views illustrating another example of a manufacture method for the solid state image pickup device of the second embodiment.

Reference is made to FIG. 5A. An n-type semiconductor substrate 50 such as a silicon substrate is prepared, and p-type impurity ions, e.g., boron ions, are implanted into the whole substrate to form an overflow barrier region 51 constituted of a p-type impurity layer and a p⁻-type impurity layer. Boron ion implantation is performed twice. For example, first ion implantation is performed at a dose of $2\times10^{11}$ to $4\times10^{11}/\text{cm}^2$ and an acceleration energy of 1.5 to 2.5 MeV, and second ion implantation is performed at a dose of $1\times10^{11}$ to $2\times10^{11}/\text{cm}^2$ and an acceleration energy of 1 to 2 MeV.

Next, by using a photoresist pattern as a mask, p-type impurity ions, e.g., boron ions, are implanted at a dose of $1\times10^{11}/\text{cm}^2$ to $2\times10^{11}/\text{cm}^2$ and an acceleration energy of 500 to 1500 keV to form a low concentration p-type impurity layer 62b above the overflow barrier region 51. The low concentration p-type impurity layer 62b is formed, e.g., near the surface of the semiconductor substrate 50 shown in FIG. 5A.

Figure 5B:
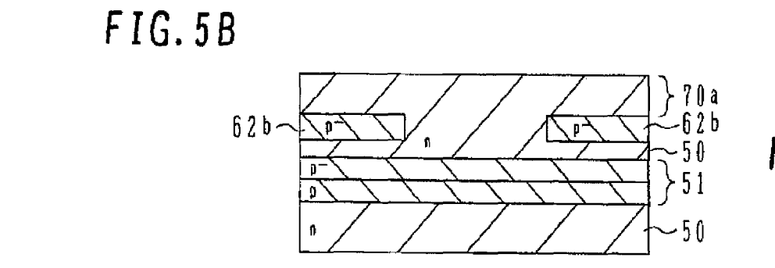

Reference is made to FIG. 5B. An epitaxial layer 70a having the same impurity concentration as that of the n-type semiconductor substrate 50 is formed on the surface of the n-type semiconductor substrate 50 shown in FIG. 5A to a thickness of, e.g., 2 μm, by epitaxial growth.

Figure 5C:
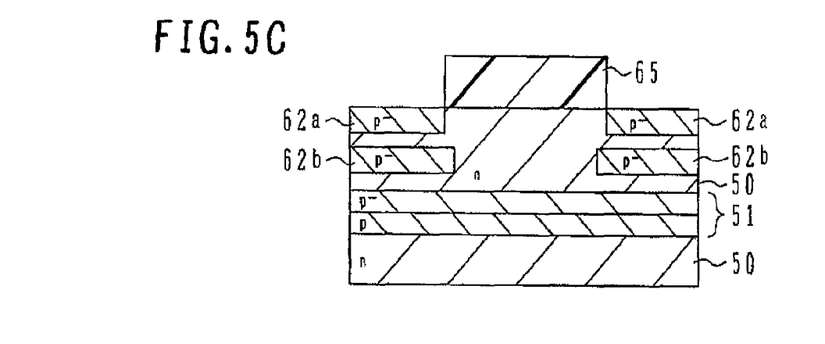

Reference is made to FIG. 5C. By using a photoresist pattern 65 as a mask, p-type impurity ions, e.g., boron ions, are implanted from the surface of the epitaxial layer 70a at a dose of $1\times10^{11}/\text{cm}^2$ to $2\times10^{11}/\text{cm}^2$ and an acceleration energy of 10 to 500 keV to form a low concentration p-type impurity layer 62a above the low concentration p-type impurity layer 62b. For example, the low concentration p-type impurity layer 62a is formed near the surface of the epitaxial layer 70a.

Figure 5D:
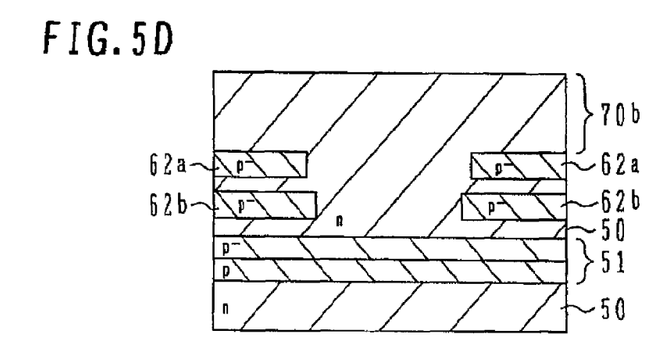

Reference is made to FIG. 5D corresponding to FIG. 4B. An epitaxial layer 70b having the same impurity concentration as that of the n-type semiconductor substrate 50 (epitaxial layer 70a) is formed on the surface of the n-type semiconductor substrate 50 (epitaxial layer 70a) shown in FIG. 5C to a thickness of, e.g., 2 μm, by epitaxial growth.

Figure 5E:
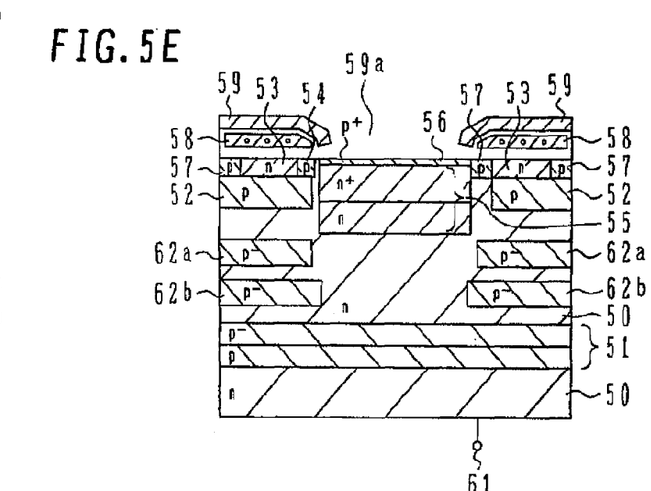

Reference is made to FIG. 5E same as FIG. 3. The manufacture processes to follow after the epitaxial layer 70b is formed are similar to those described with reference to FIG. 4C. The solid state image pickup device of the second embodiment can be manufactured by forming an epitaxial layer a plurality of times.

By forming an epitaxial layer a plurality of times, ion implantation for the overflow barrier region 51 or low concentration p-type impurity layers 62a and 62b can be performed at a lower acceleration energy than when the epitaxial layer is formed once.

Next, description will be made on the effects of the solid state image pickup devices of the first and second embodiments.

Figure 6A:
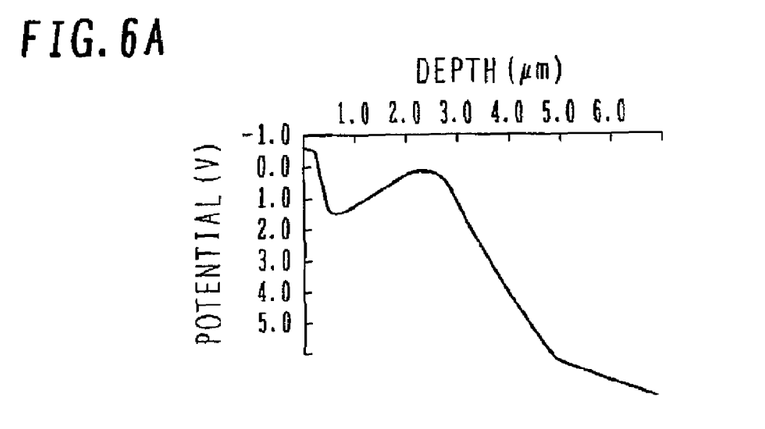
FIGS. 6A to 6C are potential diagrams of a cross section taken along line 6A-6A of the conventional solid state image pickup device shown in FIG. 9C, a cross section taken along line 6B-6B of the solid state image pickup device of the first embodiment shown in FIG. 2, and a cross section taken along line 6C-6C of the solid state image pickup device of the second embodiment shown in FIG. 3, respectively.
Figure 6B:
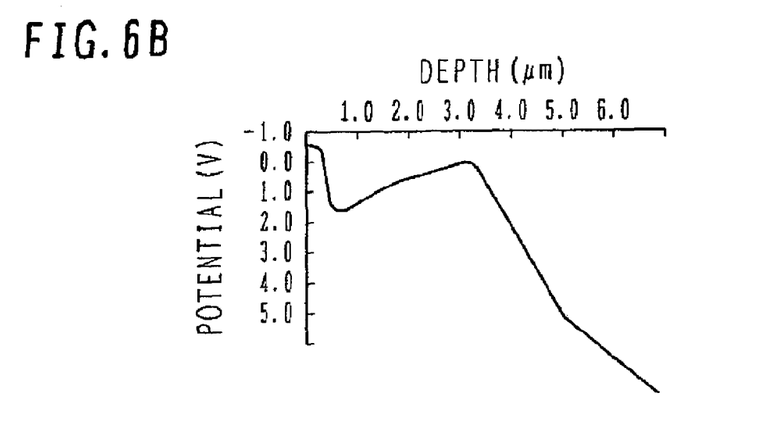
Figure 6C:
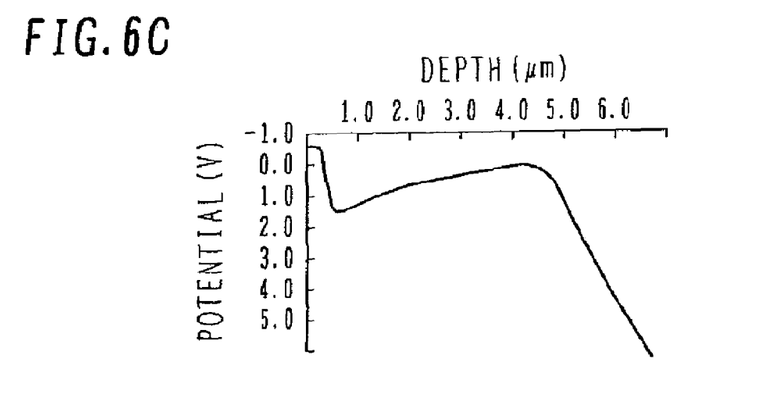

FIGS. 6A to 6C are potential diagrams of a cross section taken along line 6A-6A of the conventional solid state image pickup device shown in FIG. 9C, a cross section taken along line 6B-6B of the solid state image pickup device of the first embodiment shown in FIG. 2, and a cross section taken along line 6C-6C of the solid state image pickup device of the second embodiment shown in FIG. 3, respectively. Each potential diagram is obtained through simulation.

In each potential diagram, the abscissa represents a depth from a substrate surface in the unit of "μm" and the ordinate represents a potential in the unit of "V".

In the potential diagrams shown in FIGS. 6A to 6C, the potential at the substrate surface is −0.472 V. At a depth of about 0.6 μm, a maximum of about 1.75 V appears. This indicates that the peak of the n-type impurity concentration in the charge accumulation region is at a depth of about 0.6 μm from the semiconductor substrate surface.

Although a potential minimum is about 0.2 V in all the potential diagrams, the depth at the minimum is different in each potential diagram. In a conventional device shown in FIG. 6A, the minimum appears at a depth of about 2.5 μm. In the first embodiment shown in FIG. 6B, the minimum appears at a depth of about 3.5 μm, and in the second embodiment shown in FIG. 6C, the minimum appears at a depth of about 4.4 μm. This indicates that the peak position of the p-type impurity concentration in the overflow barrier region of the conventional device shown in FIG. 6A is at the depth of about 2.5 μm from the semiconductor substrate surface, that the peak position is at the depth of about 3.5 μm for the first embodiment shown in FIG. 6B and that the peak position is at the depth of about 4.4 μm for the second embodiment shown in FIG. 6C.

The effective depletion layers of the photoelectric conversion elements are formed at deep positions in the substrate in the deeper order of the second embodiment, the first embodiment and then the conventional device shown in FIG. 9C.

Figure 7A:
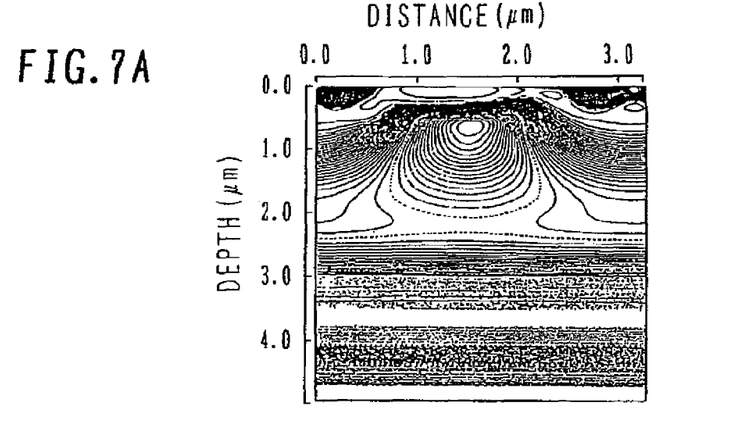
FIGS. 7A to 7C are equipotential diagrams of a cross section of the conventional solid state image pickup device shown in FIG. 9C, a cross section of the solid state image pickup device of the first embodiment shown in FIG. 2, and a cross section of the solid state image pickup device of the second embodiment shown in FIG. 3, respectively.
Figure 7B:
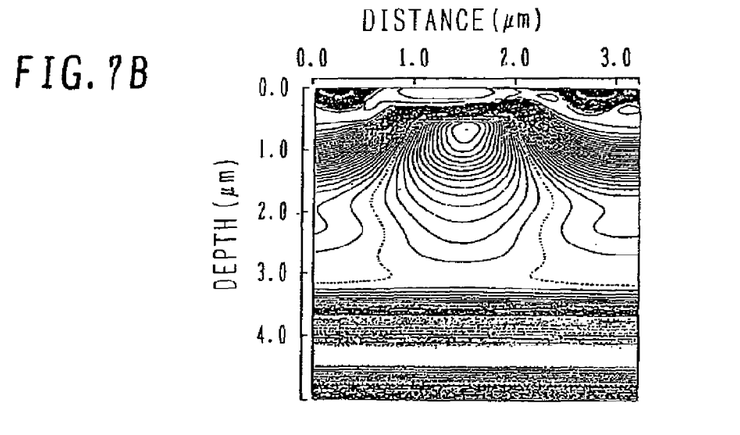
Figure 7C:
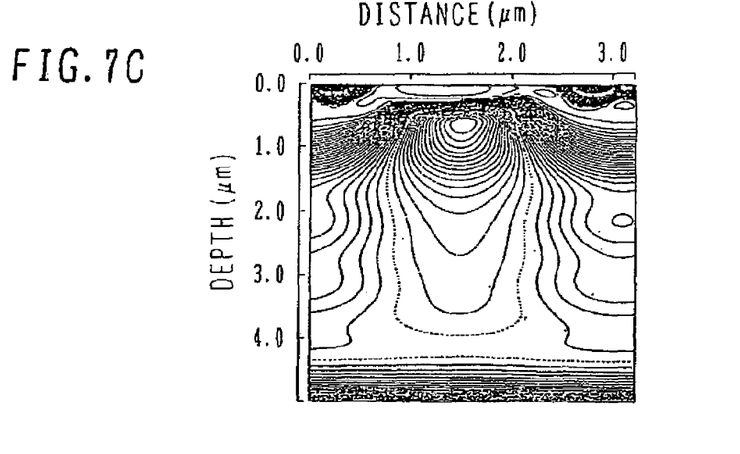

FIGS. 7A to 7C are equipotential diagrams of a cross section of the conventional solid state image pickup device shown in FIG. 9C, a cross section of the solid state image pickup device of the first embodiment shown in FIG. 2, and a cross section of the solid state image pickup device of the second embodiment shown in FIG. 3, respectively. Each equipotential diagram is obtained through simulation.

In each equipotential diagram, the abscissa represents a position in an in-plane in each cross sectional view (FIG. 9C, FIG. 2, FIG. 3) (in right and left directions in each cross sectional view), as a distance from a reference point (a distance from a reference point in the right direction in each cross sectional view), in the unit of "μm", and the ordinate represents a depth from the substrate surface in the unit of "μm".

An upper center area of each diagram (near the substrate surface), where closed curves are concentrated in a ring shape, corresponds to the charge accumulation region. Blackish right and left areas of each diagram (near the substrate surface) corresponds to the vertical transfer channels.

The depths at the potential minimums (peak positions of the p-type impurity concentration in the overflow regions) are about 2.5 μm from the substrate surface in FIG. 7A, about 3.5 μm in FIG. 7B, and about 4.4 μm in FIG. 7C. The effective depletion layer is formed shallower than these depths.

In both the first and second embodiments, the equipotential plane under the charge accumulation region is distributed to the deep position near the overflow barrier region. It can be understood from this that signal charges photoelectrically converted at the deep position near the overflow barrier region are also collected in the charge accumulation region. It is therefore effective for suppressing the sensitivity for long wavelength light from being lowered.

Further, in both the first and second embodiment, in the lateral direction under the charge accumulation region, charges moving in the right and left directions cross each equipotential plane so that carrier confinement effects are provided. The blooming between pixels can therefore be suppressed. These advantageous effects are particularly remarkable in the solid state image pickup device of the second embodiment.

The present inventors have repeated simulation and found that a solid state image pickup device can be manufactured which is sufficiently effective for suppressing a low sensitivity of long wavelength light and blooming between pixels, if the peak position of the p-type impurity concentration of the overflow region 51 is at a depth of 3 μm or deeper from the semiconductor substrate surface.

The present invention has been described in connection with the preferred embodiments. The invention is not limited only to the above embodiments. For example, n- and p-types may be reversed. It will be apparent to those skilled in the art that other various modifications, improvements, combinations, and the like can be made.

The above-described solid state image pickup device may be used with general digital cameras, apparatuses equipped with a digital camera function such as portable phones, and other apparatuses.

What we claim are:

1. A manufacture method for a solid state image pickup device comprising steps of:
   (a) implanting, into a whole surface of a semiconductor substrate of a first conductivity type, impurity ions of a second conductivity type opposite to the first conductivity type, to form an overflow barrier region;
   (b) implanting impurity ions of the second conductivity type into said semiconductor substrate above said overflow barrier region to form a first pixel separation impurity layer;
   (c) epitaxially growing a semiconductor layer on said semiconductor substrate to form an epitaxial substrate;
   (d) implanting impurity ions of the second conductivity type into said epitaxial substrate above said first pixel separation impurity layer to form a channel protective impurity layer surrounding a region where a charge accumulation region is to be formed;
   (e) implanting impurity ions of the first conductivity type into said epitaxial substrate above said channel protective impurity layer to form vertical transfer channels;
   (f) forming vertical transfer electrodes above said vertical transfer channel; and
   (g) implanting impurity ions of the first conductivity type into said epitaxial substrate in a region surrounded by said channel protective impurity layer to form the charge accumulation region, a peak position of an impurity concentration in said overflow barrier region being eventually set to a depth of 3 μm or deeper from a surface of said epitaxial substrate.

2. The manufacture method for a solid state image pickup device according to claim 1, wherein said step (d) comprises:
   (d1) implanting impurity ions of the second conductivity type into said epitaxial substrate above said first pixel separation impurity layer to form a second pixel separation impurity layer;
   (d2) epitaxially growing a semiconductor layer on said epitaxial substrate; and
   (d3) implanting impurity ions of the second conductivity type into said epitaxial substrate above said first and second pixel separation impurity layers to form said channel protective impurity layer surrounding the region where said charge accumulation region is to be formed.

3. The manufacture method for a solid state image pickup device according to claim 2, wherein implanting impurity ions of the second conductivity type at said step (d1) is performed at a third dose, and implanting impurity ions of the second conductivity type at said step (d3) is performed at a second dose larger than the third dose.

4. The manufacture method for a solid state image pickup device according to claim 2, wherein implanting impurity ions of the second conductivity type at said step (a) is performed at a fourth dose, and implanting impurity ions of the second conductivity type at said step (d1) is performed at a third dose smaller than the fourth dose.

5. The manufacture method for a solid state image pickup device according to claim 2, wherein implanting impurity ions of the second conductivity type at said step (b) is performed at a first dose, and implanting impurity ions of the second conductivity type at said step (d3) is performed at a second dose larger than the first dose.

6. The manufacture method for a solid state image pickup device according to claim 1, wherein implanting impurity ions of the second conductivity type at said step (b) is performed at a first dose, and implanting impurity ions of the second conductivity type at said step (d) is performed at a second dose larger than the first dose.

7. The manufacture method for a solid state image pickup device according to claim 1, wherein implanting impurity ions of the second conductivity type at said step (a) is performed at a fourth dose, and implanting impurity ions of the second conductivity type at said step (b) is performed at a first dose smaller than the fourth dose.

8. The manufacture method for a solid state image pickup device according to claim 1, wherein at said step (g) said charge accumulation regions are formed in a matrix shape as viewed along a normal direction of said semiconductor substrate.

9. The manufacture method for a solid state image pickup device according to claim 8, wherein at said step (g) said charge accumulation regions are formed in a matrix shape as viewed along a normal direction of said semiconductor substrate, the matrix shape including a first square matrix and a second square matrix formed at positions between lattice points of the first square matrix.

10. The manufacture method for a solid state image pickup device according to claim 1, wherein the first conductivity type is an n-type.

* * * * *